United States Patent [19]

Faust

[11] 3,804,631

[45] Apr. 16, 1974

[54] PHOTOPOLYMERIZABLE COPYING COMPOSITION

[75] Inventor: Raimund Josef Faust, Wiesbaden-Biebrich, Germany

[73] Assignee: Kalle Aktiengesellschaft, Wiesbaden-Biebrich, Germany

[22] Filed: Dec. 27, 1971

[21] Appl. No.: 212,668

[30] Foreign Application Priority Data

Dec. 28, 1970 Germany ............................ 2064080

[52] U.S. Cl. ..................... 96/115, 96/35.1, 96/86 P, 96/87 R, 204/159.15, 204/159.16

[51] Int. Cl. ............................................... G03c 1/68

[58] Field of Search ......................... 96/11 SP, 35.1; 204/159.15, 159.16

[56] References Cited

UNITED STATES PATENTS 3,458,311 6/1969 Alles ................................. 96/115 P

*Primary Examiner*—Ronald H. Smith

*Attorney, Agent, or Firm*—James E. Bryan, Esq.

[57] ABSTRACT

This invention relates to a photopolymerizable copying composition comprising at least one polymerizable compound, at least one photoinitiator and at least one copolymer of methacrylic acid and an alkyl methacrylate having an alkyl group of four to 15 carbon atoms.

8 Claims, No Drawings

PHOTOPOLYMERIZABLE COPYING COMPOSITION

This invention relates to a new photopolymerizable copying composition in a liquid form or as a solid layer on a support and containing, as essential constituents, at least one polymerizable compound, at least one photoinitiator and at least one binder soluble or at least swellable in aqueous alkali.

In using photopolymerizable copying compositions or copying materials in the reprographic field, e.g. in the photomechanical production of printing forms, generally those materials are preferred which, after exposure, can be developed with preponderantly aqueous, particularly aqueous alkaline, solutions.

Aqueous solutions have the advantage over organic solvents of low price and harmlessness, particularly physiological harmlessness. Alkaline solutions have the further advantage of a particularly good cleaning effect on the surface of many frequently employed metal supports.

Copying layers which can be developed with aqueous alkaline media are known. The desired property generally is achieved by the addition of binders soluble or at least swellable in aqueous alkaline solutions. For this purpose, polymers are used which contain carboxylic, carboxylic anhydride, or phenolic, or alcoholic hydroxy groups. Examples are cellulose esters, e.g. of dicarboxylic acis, and copolymers of acrylic or methacrylic acid with the corresponding methyl esters.

Copying layers containing such binders have proved suitable for certain purposes, e.g. for the production of offset printing plates on superficially modified aluminum supports. When using other metals as supports, e.g. chromium, brass, and particularly copper, the adhesion of such layers is insufficient, however. This becomes noticeable in the fact that, during development, not only the unexposed, but also the exposed layer parts are at least partially dissolved away.

Further problems result when the copying compositions are used for the production of etch resist layers, e.g. in the production of multimetal printing plates, relief and intaglio printing plates, printed circuits, and in chemical milling. In this connection, the residual layer remaining after development must protect as an etch resist from the attack of the etching means. Normally, the etching means cannot be prevented during etching from penetrating below the edges of the etch resist, i.e. undercutting takes place, whereby overhanging parts of the etch resist occur which are no longer supported by the support. These overhanging resist parts are particularly mechanically sensitive and may easily break off, e.g. during spray etching, the etching means again having access to new parts of the support surface. For this purpose, it has proved particularly disadvantageous that the layers produced with known binders and developable with alkaline media are comparatively brittle and easily break off under the described circumstances.

It has been attempted to overcome this drawback by the addition of plasticizers to the photopolymer layer but the adhesion of the layers generally is further impaired thereby. It also increases another undesirable property of photopolymer layers containing larger portions of low molecular weight monomers, viz. the sticking tendency.

Finally, in the case of the copolymers of acrylic or methacrylic acid and their methyl esters which are usually employed as binders, changing of the copolymerization ratio is limited in that the acid number of these polymers must be in a certain range, between about 150 and 250, in order to achieve the desirable developability with aqueous alkalies. This applies particularly to thicker layers provided for more severe etching conditions or for relief layers. However, such polymers are too brittle for many purposes and have an insufficient adhesion to many metals, particularly to copper.

The present invention provides binders for photopolymerizable compositions which do not have the described disadvantages or have them only to a substantially lesser extent.

The present invention provides a photopolymerizable copying composition containing, as essential constituents, at least one polymerizable compound, at least one photoinitiator and at least one copolymer of methacrylic acid and alkyl methacrylate. The copying composition of the invention contains a copolymer of methacrylic acid and at least one alkyl methacrylate, wherein the alkyl methacrylate or at least one of the alkyl methacrylates has an alkyl group with four to 15 carbon atoms.

In a preferred embodiment, the copying composition of the invention contains a terpolymer from (a) methacrylic acid, (b) methyl methacrylate or ethyl methacrylate and (c) an alkyl methacrylate with four to 15 carbon atoms in the alkyl group.

However, it is also possible to use copolymers prepared only from methacrylic acid and a higher alkyl acrylate, but in this case, the alkyl group generally should not contain more than eight carbon atoms. Generally, these polymers tend to the formation of tacky layers when they are combined with certain photomonomers known for this tendency. Furthermore, polymers of two components, of course, cannot be adjusted so well for certain purposes and layer combinations.

The copying layers obtained with the copying compositions of the invention are distinguished in that, after exposure, they have an excellent adhesion to all kinds of metallic supports and a high flexibility. The unexposed, i.e. the non-hardened, layer parts, however, can be removed easily and completely with aqueous alkaline developer solutions even in the case of higher layer thicknesses, whereas the hardened layer parts are not dissolved away even after a longer time of action of the developer solutions, i.e. they have a good developer resistance. In the preferred use of the copying compositions for the production of photoresist layers which are exposed and developed to give etch resists, the hardened etch resists are distinguished by excellent etching resistance and adhesion to the supports conventional for this purpose. The adhesion plays a part particularly regarding copper surfaces as they are used, for example, for the production of printed circuits, multimetal plates and intaglio printing forms and with which adhesion of photopolymer layers hitherto has represented a particular problem. The adhesion of the layers, however, is very good to other metal supports, such as chromium, zinc, brass, magnesium, and steel.

Undercutting of the etch resists obtained from the copying compositions of the invention involves solid, flexible overhanging resist parts which do not break off upon spraying with etching solution. The flexibility of the copying layer, however, is of advantage not only for etching but also for other purposes e.g. for the production of offset or relief printing forms since hairline cracks may easily occur in the brittle layer upon bending of the printing form.

The copying composition of the invention may be marketed in known manner as a solution or dispersion which is employed by the user particularly for the production of etch resists, e.g. for printed circuits, for chemical milling for etching gravure cylinders, and the like. Another commercial form substantially suitable for the same purposes is the so-called dry resist material which consists of a ready photoresist layer on an intermediate support, which layer is laminated by the user to the desired support to be etched, then exposed and, after stripping of the intermediate support usually consisting of a plastic film, developed. The copying composition of the invention is particularly suitable for this purpose. It also may be produced on an industrial scale in the form of a presensitized copying material on a suitable support, e.g. on aluminum or zinc, for the photomechanical production of offset or relief printing forms. It is further suitable for the production of relief images, screen printing stencils, and the like.

Whereas, for many properties of photopolymer layers, binders from acrylic and methacrylic esters are practically equivalent, it surprisingly has been found that practically only the methacrylic acid or its esters are suitable for the good adhesion of the copying layers to be achieved in accordance with the invention. Furthermore, the hitherto known publications, e.g. German Published Patent Application (DAS) No. 1,194,707, which disclose binders for photopolymer layers from higher alkyl acrylates and alkyl methacrylates, e.g. butyl acrylates, and other acid monomers do not disclose that these copolymers differ in their properties from those with methacrylate units, for example.

The acid number of the copolymers used in accordance with the invention should range between about 100 and 250. When thicker layers, e.g. of more than about 20 $\mu$, are to be prepared, the acid number preferably is adjusted between 150 and 250 for achieving sufficiently rapid development.

In the terpolymers preferably used in accordance with the invention, the ratio by weight of component (b), which is preferably methyl methacrylate, to component (c) generally is between 4:1 and 1:10. The ratio by weight substantially corresponds to the ratio of monomers employed because the alkyl methacrylates do not differ very much in their polymerization rate. The proportion of methacrylic acid in the polymer, however, may considerably differ from the ratio of the monomers employed, depending on the polymerization conditions, so that exact data are possible concerning only the determination of the acid number.

Of the higher alkyl methacrylates, preferably used are those comonomers with about five to eight carbon atoms in the alkyl group, particularly preferably used is the hexyl methacrylate. When using such alkyl methacrylates in combination with methyl methacrylate, the preferred ratio of components (b) and (c) ranges between 2:1 and 1:8. Of higher alkyl methacrylates, there are usually employed smaller quantities, and vice versa.

The molecular weights of the binders used in accordance with the invention may vary within wide limits. Generally, they should range from 20,000 to 200,000.

Besides monomers, photoinitiators and the described binders, the copying composition of the invention may further contain a number of other additives, e.g.:

Inhibitors to prevent thermal polymerization of the compositions, hydrogen donors,
substances modifying the sensitometric properties of such layers, dyes,
colored and uncolored pigments,
color precursors, and
indicators.

These constituents advantageously should be so selected that they absorb as little as possible in the actinic range important for the initiating process.

As photoinitiators in the copying composition of the invention, there may be used a variety of substances, e.g. benzoin, benzoin ether, multinuclear quinones, e.g. 2-ethyl-anthraquinone, acridine derivatives, e.g. 9-phenyl-acridine, 9-p-methoxyphenyl-acridine, 9-acetylaminoacridine, benz(a)-acridine; phenazine derivatives, e.g. 9-10-dimethylbenz(a)-phenazine, 9-methyl-benz(a)-phenazine, 10-methoxy-benz(a)-phenazine; quinoxaline derivatives, e.g. 6,4′,4″-trimethoxy-2,3-diphenyl-quinoxaline, 4′,4″-dimethoxy-2,3-diphenyl-5-aza-quinoxaline; and quinazoline derivatives.

Photopolymerizable monomers suitable for the copying composition of the invention are known and described in U.S. Pat. Nos. 2,760,863 and 3,060,023, for example. Examples thereof are acrylic and methacrylic esters, such as diglycerol diacrylate, polyethylene glycol dimethacrylate, acrylates and methacrylates of trimethylol ethane, trimethylol propane and pentaerythritol and of polyhydric alicyclic alcohols. Particularly advantageously employed are reaction products of diisocyanates and partial esters of polyhydric alcohols, as described above. Such monomers are described and claimed in copending application Ser. No. 212,372, filed Dec. 27, 1971, and now abandoned. Generally, the methacrylates are preferred over the acrylates.

In addition to the copolymers used in accordance with the invention, the copying composition may contain other binders in smaller quantities, e.g. those insoluble in aqueous alkali. Care should be taken that the advantages achieved by the copolymers described above are not too greatly impaired by such additions.

Although the copying compositions of the invention are relatively insensitive to the oxygen contained in the air, it is frequently advantageous to protect the compositions effectively from access to oxygen during photopolymerization. When the composition is used in the form of a presensitized copying material, it is advantageous to apply a suitable covering film of low oxygen permeability. The film may be self-supporting and may be peeled off prior to development of the copying layer, or preferably may consist of a material which dissolves in the developer liquid or can at least be removed in the non-hardened areas during development. Suitable materials for this purpose include waxes, polyvinyl alcohol, polyphosphates, and sugar. When the composition is in the form of a transferrable photoresist layer on an intermediate support, it advantageously may be covered on the other layer side with a thin strippable protective film, e.g. of polyethylene.

Suitable supports for copying materials prepared with the copying composition of the invention are: metal foils, such as aluminum, steel, zinc and copper foils; plastic films, such as polyethylene terephthalate or cellulose acetate films; and screen printing supports, such as "Perlon" gauze. The support surface may be pretreated chemically or mechanically in order to properly adjust the adhesion of the layer or to reduce the reflection of the support within the actinic range of the copying layer (anti-halation).

The light-sensitive materials in which the copying composition of the invention is employed are produced in known manner. The copying composition may be dissolved or dispersed in a solvent and the resulting solution or dispersion may be applied as a film to the selected support, for example, by casting, spraying, immersion or roller application, and then dried. Thick layers (e.g. of 250 μ or more) may be produced in the form of self-supporting films, by extrusion or calendering, and then laminated to the support.

The copying layers are exposed and developed in known manner. Suitable developers are preferably aqueous alkaline solutions, e.g. of alkali phosphates or alkali silicates, to which optionally small quantities of miscible organic solvents may be added.

As mentioned above, the copying compositions of the invention may be used in various fields. They are particularly advantageously employed for the production of photoresist or etch resist layers on metallic supports. They are particularly suitable for the application to supports of copper, as they are used for example for the production of printed circuits, of intaglio printing forms and of multimetal offset printing forms. The excellent adhesion and flexibility of the exposed layer parts prove suitable particularly in these preferred fields of use.

The copying compositions may be employed and handled particularly advantageously in the form of so-called dry resist materials as they are mentioned above since they also can be transferred in the dry state to metal supports to give firmly adhering layers. In this case, polyester films are particularly suitable as transparent intermediate supports.

The following examples illustrate some embodiments of the copying composition of the invention. Unless otherwise stated, percentages and quantitative ratios are by weight. The relation between parts by weight and parts by volume corresponds to that between grams and milliliters. The quantities by weight of the monomers in the copolymers are the quantities employed for polymerization.

EXAMPLE 1

A photoresist solution suitable for the production of printed circuits, halftone gravure forms and for chemical milling is prepared from the following constituents:

| | |
|---|---|
| 2.8 parts by weight | of a terpolymer of methyl methacrylate, n-hexylmethacrylate, and methacrylic acid (70:375:90), having an acid number of 209, |
| 2.8 parts by weight | of the monomer described below, |
| 0.2 part by weight | of 9-phenyl-acridine, |
| 0.25 part by weight | of triethylene glycol diacetate, |
| 0.03 part by weight | of tri-[4-(3-methyl-phenylamino)-phenyl]-methylacetate, and |
| 30.0 parts by volume | of ethylene glycol monoethyl ether. |

The solution is applied by immersion or whirl-coating to a phenoplast plate laminated with a 35 μ thick copper foil to give layer thicknesses of 3 to 10 μ, preferably 5 μ, (dry) and dried for 2 minutes at 100°C.

The photomonomer used is prepared as follows:

6,750 parts by volume of dry benzene, 1,170 parts by weight of hydroxyethyl methacrylate, 945 parts by weight of 2,2,4-trimethyl-hexamethylene diisocyanate, and 4.5 parts by weight of diethyl cyclohexylamine with the addition of 45 parts by weight of copper powder are heated for 4 hours with slight boiling in a three-necked flask equipped with stirrer, reflux condenser, and drying tube. After cooling, the copper is filtered off and the benzene solution is shaken twice with 1,000 parts by volume of saturated NaCl solution and once with water. 10.5 parts by weight of hydroquinone monomethyl ether are then added to the benzene solution and the benzene is removed in individual portions in a revolving vacuum evaporator at 50°C.

The terpolymer used is prepared as follows:

In a three-necked flask equipped with reflux condenser, stirrer and gas introduction tube with the introduction of nitrogen, there are polymerized, for 7 hours at 80°C, 75 parts by weight of methyl methacrylate, 375 parts by weight of n-hexyl-methacrylate and 90 parts by weight of methacrylic acid in 3,000 parts by volume of gasoline of a boiling point of 100° to 140°C, with 6 parts by weight of azodiisobutyronitrile as the initiator, and 2 parts by weight of n-dodecylmercaptan as the controlling agent. After cooling the mixture, the precipitated polymer is filtered off and washed with small portions of light gasoline. The product is dried in the vacuum drying cabinet at 50°C.

Yield: 267 g

Acid number: 209

The reduced specific viscosity of a 1 per cent solution of the terpolymer in ethylene glycol monoethyl ether (RSV value) is 2.58 centistokes.

In a xenon copying device manufactured by Klimsch & Co., Frankfurt/Main, Germany, (type Bikop, Model Z) and having an output of 8 kW, the layer is exposed for 1 minute at a distance of 80 cm between the lamp and the copying frame under a combined negative original consisting of a 21-step continuous tone grey wedge which has a density range of 0.05 to 3.05 with density increments of 0.15 and line and dot screen originals having 60 and 120 screen elements per cm.

The exposed copying layer is developed with an aqueous alkaline developer of a pH value of 11.3 and having the following composition:

1,000 parts by weight of water, 1.5 parts by weight of sodium metasilicate nonahydrate, 3 parts by weight of Polyglycol 6000, 0.6 part by weight of levulinic acid, and 0.3 part by weight of strontium hydroxide octahydrate. The plate is wiped over with the developer for 30 to 60 seconds and then rinsed with water. Fixation is performed with 1 per cent phosphoric acid and the plate is then inked up with black greasy ink.

An excellently adhering etch resist with a very good resolution is obtained. The developer resistance is so good that, at 10 times the development time, still no attack of the developer onto the etch resist can be observed. The copper surfaces bared after development are etched at 42°C with a $FeCl_3$ solution of 42°Be. The etching time in a spray etching machine manufactured by Chemcut, Solingen, Germany, type 412 G, is about 45 seconds. The etching resistance of the resist layer is excellent. Upon undercutting, satisfactorily flexible overhanging resist parts which do not break off are obtained. Under the conditions described, nine fully hardened wedge steps are obtained.

Instead of the polymer binder used above, it is also possible to use equal quantities of a terpolymer of methyl methacrylate, n-butylmethacrylate and methacrylic acid (70:375:90), having an acid number of 198, or a terpolymer of methyl methacrylate, decyl methacrylate and methacrylic acid (70:375:90), having an acid number of 170. When processing is the same as above, nine fully exposed wedge steps are obtained in each case.

In addition to the mentioned favorable properties, the described etch resist layer also has a good resistance to strongly acid (pH below 1) electroplating baths, e.g. in the tin electroplating bath, type Glanzzinnbad CULMO; in the Sn/Pb electroplating bath, type LA; and in the copper electroplating bath, type Feinkornkupferplasticbad MS, all of Dr. Ing. Max Schlotter, Geislingen-Steige, Germany; and in the Au electroplating bath, type Autronex N NB 181250 of Blasberg GmbH & Co., Solingen, Germany. This photoresist solution has an excellent storability which can be further improved by the addition of radical inhibitors.

The liquid photoresist composition described above also may be used as a dry resist, when it is processed as described in Example 2. As a dry resist, the mentioned mixture has similarly good properties.

EXAMPLE 2

A solution of

| | |
|---|---|
| 8.4 parts by weight | of a terpolymer from methyl methacrylate, n-hexylmethacrylate and methacrylic acid (25:125:30), of an acid number of 202, |
| 8.4 parts by weight | of the monomer used in Example 1, |
| 0.3 part by weight | of 1,2-benzacridine, |
| 0.75 part by weight | of triethylene glycol diacetate, |
| 0.3 part by weight | of polyoxyethylene sorbitan monooleate, |
| 0.12 part by weight | of the dye used in Example 1 |
| in | |
| 60.0 parts by volume | of ethylene glycol monoethyl ether |

is whirl-coated onto biaxially stretched 25 μ thick polyethylene terephthalate film so that, after drying for 2 minutes at 100°C, a layer thickness of 10 μ is obtained. A dry resist film of excellent flexibility and with a non-tacky surface at room temperature is obtained. The dry resist is laminated by means of a laminator, type 9 LD manufactured by General Binding Corporation, U.S.A., at 130°C to a phenoplast plate to which a 35 μ thick copper foil has been laminated, exposed for 1 minute to a 5 kW xenon point light lamp, type COP 5000 of Staub, Neu-Isenburg, Germany, and, after stripping of the polyester film, developed as in Example 1. The etch resist has similarly good properties regarding developer resistance, etching resistance and resistance to electroplating baths, as described in Example 1.

Wedge steps obtained: 8.

Also in this case, an excellent storability of the light-sensitive dry resist material can be observed.

EXAMPLE 3

A solution of

| | |
|---|---|
| 2.8 parts by weight | of the terpolymer used in Example 2, |
| 2.8 parts by weight | of the monomer used in Example 1, |
| 0.5 part by weight | of diethylene glycol monohexyl ether, |
| 0.03 part by weight | of the dye used in Example 1, |
| 0.025 part by weight | of 9-phenyl-acridine |
| in | |
| 12.0 parts by volume | of ethylene glycol monoethyl ether |

is whirl-coated onto a 25 μ thick polyethylene terephthalate film in such a manner that, after drying (8 minutes fan, 3 minutes at 100°C in a drying cabinet), a layer thickness of 25 μ is obtained. As described in Example 2, the dry resist film is laminated to a phenoplast plate laminated with copper. After development for 2 minutes, a cleanly developed image of the original is obtained. The developer resistance and the etching resistance as well as all properties described in Examples 1 and 2 are excellent.

Wedge steps obtained: 8.

This mixture may also be processed to give higher layer thicknesses (35, 60, and 120 μ) and used as a dry resist.

EXAMPLE 4

A coating solution is prepared from

| | |
|---|---|
| 2.8 parts by weight | of trimethylol ethane triacrylate, |
| 2.8 parts by weight | of a terpolymer from 150 parts by weight of methyl methacrylate, 750 parts by weight of n-hexylmethacrylate, and 300 parts by weight of methacrylic acid, of an acid number of 161, |
| 0.1 part by weight | of 9-phenyl-acridine, |
| 0.02 part by weight | of bis-(p-dimethylamino-benzal)-acetone, |
| 0.03 part by weight | of the dye used in Example 1, and |
| 30.0 parts by volume | of ethylene glycol monoethyl ether |

and whirl-coated onto a bimetal plate of brass and chromium and dried. As described in Example 1, the plate is then exposed for 1 minute under a positive original and developed. The bared chromium is then etched away within about 2 minutes with a solution from 17.4 per cent of $CaCl_2$, 35.3 per cent of $ZnCl_2$, 2.1 per cent of HCl, and 45.2 per cent of water and the etch resist is removed with ethylene glycol monoethyl ether/acetone. The plate is then wiped over with 1 per cent phosphoric acid and inked up with greasy ink.

Instead of the above binder, it is also possible to employ the same quantity of a terpolymer from 200 g of methyl methacrylate, 100 g of decyl methacrylate, and 120 g of methacrylic acid with the acid number of 203, similar results being achieved thereby.

Layers with a slight tendency to tackiness are obtained when using, instead of the above terpolymer, the same quantity of a copolymer of n-butyl-methacrylate and methacrylic acid with the acid number of 174. The adhesion of the layer is also good.

When using, instead of the above binder, the same quantity of a copolymer from methyl methacrylate and methacrylic acid with the number of 188.5, a copying layer is obtained which has an insufficient adhesion to chromium.

EXAMPLE 5

A solution of

| | |
|---|---|
| 2.8 parts by weight | of the terpolymer used in Example 2, |
| 2.8 parts by weight | of the monomer used in Example 1, |
| 0.12 part by weight | of 1,2-benzacridine, |

-Continued

| | |
|---|---|
| 0.1 part by weight | of mercaptobenzthiazole, |
| 0.25 part by weight | of triethylene glycol diacetate, and |
| 0.04 part by weight | of the dye used in Exmaple 1 |

in 20 parts by volume of ethylene glycol monoethyl ether is purified by filtration from possibly occurring undissolved portions. The coating solution is then whirl-coated onto the support indicated below. The plates obtained are dried for 2 minutes at 100°C in a drying cabinet, the weight of the layer ranges from 4 to 10 g/m².

The layer is exposed and developed as described in Example 1. Fixation is then performed with 1 per cent phosphoric acid and the plate is then inked up with black greasy ink.

The following are used as support materials:

a. aluminum mechanically roughened by means of wire brushes,
b. electrolytically roughened and anodized aluminum with 3 g of oxide/m²,
c. sheet chromium,
d. sheet steel,
e. sheet steel, tin-plated.

Good adhesion of the photopolymer layer to all support materials is achieved. Dissolution of the non-image areas can be performed cleanly so that even the fine dots of the screen having 120 screen elements per cm are faithfully reproduced.

The relative light-sensitivity of the plates exposed as described above is 5 to 6 wedge steps in the case of supports (a), (c), (d), and (e) and 7 to 8 wedge steps in the case of the more modified support (b). The printing plates thus obtained can be directly used for offset printing.

As shown by the example, it is not necessary to apply an oxygen barrier layer to the copying layer. When nevertheless applying a top layer of sugar, methyl cellulose and saponin (2 : 1 : 0.15) from a solution in 96.85 parts by weight of water, two to three wedge steps more are obtained on an average.

The copying layers with and without a top layer have non-tacky surfaces of good feel. The developer resistance of these layers is very good.

The planographic printing plates yield more than 100,000 good prints in an offset printing machine, type Dualith 500 manufactured by Messrs. Davidson, U.S.A. The storability of the copying layer is excellent.

EXAMPLE 6

A solution of

| | |
|---|---|
| 1.4 parts by weight | of trimethylol ethane triacrylate, |
| 1.4 parts by weight | of the terpolymer used in Example 4, having an acid number of 161, |
| 0.05 part by weight | of 9-phenyl-acridine, |
| 0.01 part by weight | of bis-(p-dimethylamino-benzal)-acetone, and |
| 0.015 part by weight | of the dye used in Example 1 |
| in | |
| 15.0 parts by volume | of ethylene glycol monoethyl ether |

is applied to electrolytically roughened and anaodized aluminum with 3 g of oxide per $m^2$ and dried, as in Example 5. The layer is exposed and developed as in Example 1; seven fully exposed wedge steps and additionally one discernible wedge step are obtained.

Instead of the mentioned binder, it is also possible to employ the same quantity of the terpolymer indicated in Example 4 with the acid number of 203; six full wedge steps and one discernible wedge step are obtained.

EXAMPLE 7

A solution of

| | |
|---|---|
| 1.4 parts by weight | of 2,2,5,5-tetra-acryloxymethyl-cyclopentanone, |
| 1.4 parts by weight | of the terpolymer used in Example 4, having an acid number of 161, |
| 0.05 part by weight | of 9-phenyl-acridine, |
| 0.015 part by weight | of the dye used in Example 1, and |
| 15.0 parts by volume | of ethylene glycol monoethyl ether |

is applied to electrolytically roughened and anodized aluminum with 3 g of oxide per $m^2$ and dried, as in Example 5. Exposure is performed for 1 minute under a negative original to the light source indicated in Example 1 and development is the same as in Example 1.

Wedge steps obtained 4 (6).

The monomer used is prepared as follows:

| | |
|---|---|
| 200 parts by weight | of 2,2,5,5-tetra-hydroxymethyl-cyclopentanone, |
| 430 parts by weight | of acrylic acid, |
| 600 parts by weight | of benzene, |
| 10 parts by weight | of concentrated sulfuric acid, and |
| 2 parts by weight | of copper-I-oxide |

are mixed in a three-necked flask equipped with stirrer, water separator and reflux condenser and the mixture is heated with reflux and stirring. In about 3 to 5 hours, the calculated quantity of water is separated azeotropically. After cooling of the reaction mixture, the acid excess is removed by washing with 10 to 20 per cent sodium chloride solution and then with 15 to 25 per cent potassium bicarbonate solution. After separation and drying of the organic phase with sodium sulfate, this phase is freed from benzene by vacuum distillation with the addition of 5 parts by weight of *p*-methoxyphenol. The resulting residue is the desired tetraester of the polyalcohol in a yield of 90 per cent of the theoretical value.

EXAMPLE 8

A printing foil suitable for letterpress printing is produced from the following constituents:

| | |
|---|---|
| 10.0 parts by weight | of the terpolymer used in Example 2, |
| 6.0 parts by weight | of the monomer used in Example 1, |
| 1.0 part by weight | of triethylene glycol diacetate, and |
| 0.06 part by weight | of benzoin isopropyl ether. |

The components are dissolved in 25 ml of ethylene glycol monoethyl ether and the solution is cast onto a horizontal electrolytically roughened and anodized aluminum support and dried. The dry about 1 mm thick layer is exposed for 10 minutes at a distance of 5 cm under a combined original, containing line screened parts and text parts, by means of a tubular exposure device manufactured by Moll, Solingen-Wald, Germany, and having fluorescent tubes arranged closely side by side of the type Philips TLAK -40 W/05. Development is performed with an aqueous alkaline developer as described in Example 1. After slightly rubbing the exposed plate for about 15 to 20 minutes by means of a brush in the developer bath, a relief with sharp outlines and a relief depth of 0.5 mm and a resolution of up to 56 lines/cm is obtained.

EXAMPLE 9

A relief printing plate is produced by coating a zinc plate suitable for powderless etching with an etch resist layer. The etch resist layer has the following composition:

| | |
|---|---|
| 2.8 parts by weight | of the terpolymer used in Example 1, having an acid number of 209, |
| 2.8 parts by weight | of the monomer used in Example 1, |
| 0.1 part by weight | of 9-phenyl-acridine, |
| 0.1 part by weight | of polyoxyethylene sorbitan monooleate, |
| 0.04 part by weight | of the dye used in Example 1, and |
| 13.0 parts by weight | of ethylene glycol monoethyl ether. |

The solution is filtered and whirl-coated onto the zinc plate.

Exposure is performed for 1.5 minutes by means of the light source indicated in Example 2 under a line screen original together with a Kodak step wedge. After development for 1 minute with the developer described in Example 1, a good image of the original is obtained. Wedge steps obtained: 6.

For the production of a relief printing form, the bared zinc surface is etched for 5 minutes at room temperature with 6 per cent nitric acid. Parallel tests with a machine for powderless etching with 6 per cent nitric acid at 27°C also yield after 30 minutes printing forms which are suitable for letterpress printing.

It will be obvious to those skilled in the art that many modifications may be made within the scope of the present invention without departing from the spirit thereof, and the invention includes all such modifications.

What is claimed is:

1. A photopolymerizable copying composition comprising at least one polymerizable compound, at least one photoinitiator and at least one copolymer of methacrylic acid and an alkyl methacrylate having an alkyl group of four to 15 carbon atoms.

2. A copying composition according to claim 1 containing a terpolymer of (a) methacrylic acid, (b) methyl methacrylate or ethyl methacrylate and (c) an alkyl methacrylate having four to 15 carbon atoms in the alkyl group.

3. A copying composition according to claim 1, in which the copolymer has an acid number of 100 to 250.

4. A copying composition according to claim 2 in which the ratio by weight of component (b) to component (c) ranges from 4 : 1 to 1 : 10.

5. A copying composition according to claim 1 in which the copolymer has a molecular weight between 20,000 and 200,000.

6. A copying composition according to claim 2 in which component (c) of the terpolymer is an alkyl methacrylate having five to eight carbon atoms in the alkyl group.

7. A copying composition according to claim 2 in which component (b) is methyl methacrylate.

8. A copying composition according to claim 6 in which the ratio by weight of component (b) to component (c) ranges from 1 : 2 to 1 : 8.

* * * * *